United States Patent
Yang et al.

(10) Patent No.: US 9,667,204 B2
(45) Date of Patent: May 30, 2017

(54) DYNAMIC BIAS MODULATOR WITH MULTIPLE OUTPUT VOLTAGE CONVERTER AND POWER AMPLIFICATION APPARATUS USING THE SAME

(71) Applicant: RESEARCH & BUSINESS FOUNDATION SUNGKYUNKWAN UNIVERSITY, Suwon-si (KR)

(72) Inventors: Youngoo Yang, Hwaseong-si (KR); Jong Seok Bae, Suwon-si (KR); Sung Jae Oh, Suwon-si (KR); Soo Ho Cho, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 15/145,292

(22) Filed: May 3, 2016

(65) Prior Publication Data

US 2017/0040955 A1    Feb. 9, 2017

(30) Foreign Application Priority Data

Aug. 7, 2015   (KR) .................. 10-2015-0111620

(51) Int. Cl.
    *H03G 3/20*     (2006.01)
    *H03F 3/21*     (2006.01)
    *H03F 3/19*     (2006.01)

(52) U.S. Cl.
    CPC ............... *H03F 3/21* (2013.01); *H03F 3/19* (2013.01); *H03F 2200/102* (2013.01); *H03F 2200/451* (2013.01); *H03F 2200/511* (2013.01); *H03F 2200/555* (2013.01)

(58) Field of Classification Search
    CPC ..................................................... H03G 3/20
    USPC ........................................ 330/136, 297, 129
    See application file for complete search history.

(56) References Cited

U.S. PATENT DOCUMENTS

| | | | | |
|---|---|---|---|---|
| 6,891,438 B2* | 5/2005 | Arai | ............... | H03F 1/301 330/136 |
| 7,193,470 B2* | 3/2007 | Lee | ............... | H03F 1/0222 330/136 |
| 7,859,336 B2* | 12/2010 | Markowski | ......... | H03F 1/0227 330/136 |
| 8,493,142 B2* | 7/2013 | Tadano | ............... | H03G 3/3042 330/127 |
| 8,902,002 B2* | 12/2014 | Fagg | ............... | H03F 1/0266 330/127 |

* cited by examiner

*Primary Examiner* — Henry Choe
(74) *Attorney, Agent, or Firm* — NSIP Law

(57) ABSTRACT

A power amplification apparatus includes a multiple output bias voltage generation unit, a dynamic bias modulator, and a power amplifier. The multiple output bias voltage generation unit generates first and second bias voltages using an inductor coupled between an input voltage and a plurality of capacitors. The capacitors are connected to the inductor in a non-overlapping manner. The dynamic bias modulator outputs the first bias voltage or the second bias voltage as a variable bias voltage based on results of comparing voltage of an envelope signal of a radio frequency (RF) signal to an envelope reference voltage. The power amplifier is biased in response to the variable bias voltage, amplifies power of the RF signal, and outputs the amplified RF signal to an antenna.

12 Claims, 5 Drawing Sheets

DYNAMIC BIAS MODULATOR WITH MULTIPLE OUTPUT VOLTAGE CONVERTER AND POWER AMPLIFICATION APPARATUS USING THE SAME

CROSS-REFERENCE TO RELATED APPLICATION

This application claims the benefit under 35 USC 119(a) of Korean Patent Application No. 10-2015-0111620 filed on Aug. 7, 2015 in the Korean Intellectual Property Office, the entire disclosure of which is incorporated herein by reference for all purposes.

BACKGROUND

1. Field

The following description relates to a power amplification apparatus, and such as to a power amplification apparatus using a dynamic bias modulator.

2. Description of Related Art

Recent wireless communication systems use a modulation method having high peak to average power ratio (PAPR), such as orthogonal frequency division multiplexing (OFDM), so as to efficiently use limited frequency resources and also process a large amount of data.

In a modulation method having high PAPR, in order to maximize efficiency, a power amplifier (PA) may be implemented as a highly efficient PA, e.g., Class C, D, E or F amplifier. Although such power amplifiers (PAs) can operate at high efficiency in a compression region, i.e., a saturation region, they require an additional linearization technique due to the nonlinearity of the compression region, which reduces efficiency of the overall system.

Furthermore, although PAs in class C, D, E or F operate at high efficiency, the efficiency of the PAs is less at a region lower than a maximum power point, i.e., a back-off region. During most of operating periods, wireless communication systems operate in the back-off region, which results in lower average power ratio.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general embodiment, a power amplification apparatus includes a multiple output bias voltage generation unit, a dynamic bias modulator, and a power amplifier. The multiple output bias voltage generation unit generates first and second bias voltages using an inductor coupled between an input voltage and a plurality of capacitors. The capacitors are connected to the inductor in a non-overlapping manner. The dynamic bias modulator outputs the first bias voltage or the second bias voltage as a variable bias voltage based on results of comparing voltage of an envelope signal of a radio frequency (RF) signal to an envelope reference voltage. The power amplifier is biased in response to the variable bias voltage, and amplifies power of the RF signal, and outputs the amplified RF signal to an antenna.

The inductor may be switchingly connected to the input voltage. The multiple output bias voltage generation unit may be operative to intermittently accumulate energy in the inductor in response to an inductor switching signal and generate the first and second bias voltages having different voltage levels from energy with which the first and second capacitors have been charged by selectively transferring the energy of the inductor to one of the plurality of capacitors in response to first and second switching signals.

The multiple output bias voltage generation unit may include a switching signal generation unit configured to generate the inductor switching signal, the first switching signal, and the second switching signal. The switching signal generation unit may be operative to: amplify an error obtained by comparing the first bias voltage with the first reference voltage, and generate a pulse width-modulated inductor switching signal based on results of comparison between the amplified error and a triangular or sawtooth wave in a predetermined period; and amplify an error obtained by comparing the second bias voltage with second reference voltage, and generate a pulse width-modulated first and second switching signals based on results of comparison between the amplified error and the triangular or sawtooth wave. The first switching signal and the second switching signal may be complementary to each other.

The switching signal generation unit may be operative to discontinuously adjust the first and second reference voltages based on magnitude of average output power.

The switching signal generation unit may be operative to discontinuously adjust amplification gains related to errors obtained by comparing the first and second bias voltages with the first and second reference voltages, respectively, based on magnitude of average output power.

The switching signal generation unit may be operative to continuously vary the first and second reference voltages based on magnitude of average output power.

The switching signal generation unit may be operative to continuously vary amplification gains related to errors obtained by comparing the first and second bias voltages with the first and second reference voltages, respectively, based on magnitude of average output power.

In response to the average output power being higher than a predetermined upper limit level or lower than a predetermined lower limit level, the dynamic bias modulator may be operative to output only one of the first and second bias voltages as the variable bias voltage based on magnitude of the average output power, in preference to results of comparison between voltage of the envelope signal and the envelope reference voltage.

The dynamic bias modulator may be operative to output the relatively high first bias voltage as the variable bias voltage regardless of magnitude of the envelope signal in response to the average output power being higher than a predetermined upper limit level and output the relatively low second bias voltage as the variable bias voltage regardless of magnitude of the envelope signal in response to the average output power being lower than a predetermined lower limit level.

The multiple output bias voltage generation unit may be operative to feed either the first bias voltage or the second bias voltage to the dynamic bias modulator by exclusively connecting only one of the plurality of capacitors, selected based on the magnitude of the average output power, to the inductor.

The first and second bias voltages may have different voltage levels.

In another general aspect, a power amplification method is disclosed using a power amplification apparatus with a multiple output voltage converter. The power amplification apparatus generates first and second bias voltages having different voltage levels using a single inductor coupled between an input voltage and a plurality of capacitors. The plurality of capacitors are connected to the inductor in a non-overlapping manner. The power amplification apparatus outputs the first bias voltage or the second bias voltage as variable bias voltage based on results of comparing voltage of an envelope signal of a radio frequency (RF) signal to an envelope reference voltage. The power amplification apparatus also amplifies power of the RF signal via a power amplifier configured to be biased in response to the variable bias voltage, and outputting the amplified RF signal to an antenna.

Other features and aspects will be apparent from the following detailed description, the drawings, and the claims.

Figure 1:
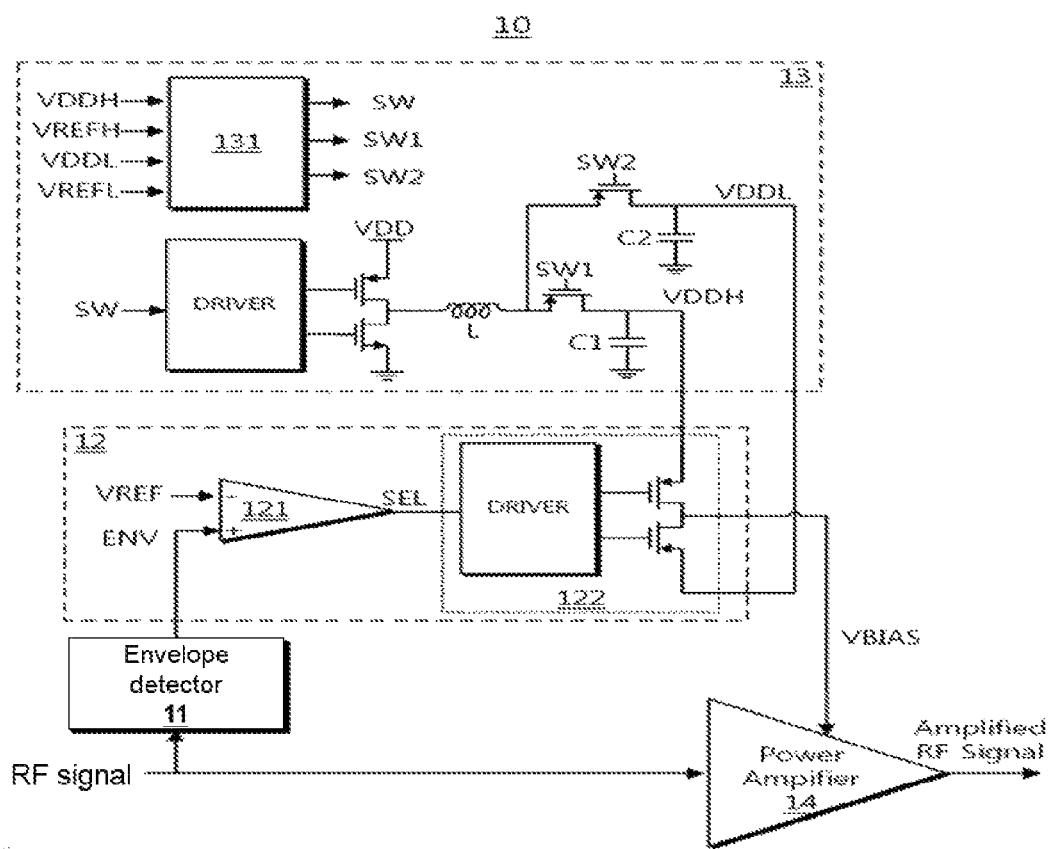
FIG. 1 is a circuit diagram illustrating an example of a dynamic bias modulator with a multiple output voltage converter and a power amplification apparatus using the same.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

In order to improve efficiency using limited resource, a bias modulation technique has been proposed for applying a bias voltage with varying voltage level responsive to the envelope of an RF input signal, rather than applying the bias voltage to a power amplifier in a fixed manner.

Bias modulation techniques may be divided into a continuous bias modulation technique and a discontinuous bias modulation technique.

The continuous bias modulation technique is a technique for feeding bias voltage that varies at continuous voltage levels, whereas, the discontinuous bias modulation technique feeds bias voltage that varies about discontinuous voltage levels.

The discontinuous bias modulation technique is advantageous over the continuous bias modulation technique because it has simple circuitry and easy to control; however, the discontinuous bias modulation technique occupies a large chip or substrate area to implement. The large chip or substrate area is due to the number of DC-DC voltage conversion circuits needed for the discontinuous bias modulator, with each discontinuous bias modulator including an inductor.

Therefore, a demand exist for developing a dynamic bias modulation technique that can be implemented using a simple circuit structure occupying a relatively small chip or substrate area.

FIG. 1 is a circuit diagram illustrating a dynamic bias modulator with a multiple output voltage converter and a power amplification apparatus 10 using the same according to an embodiment of the present disclosure.

The power amplification apparatus 10 includes an envelope detector 11, a dynamic bias modulator 12, a multiple output bias voltage generation unit 13, and a power amplifier 14.

The envelope detector 11 detects an envelope signal ENV from an RF signal input to the power amplifier 14 for the purpose of power amplification. The envelope detector 11 may be simply composed of a rectifier diode and a low-pass filter that are connected in series when it is implemented in an analog manner. The envelope detector 11 may apply an RF signal to the rectifier diode, and may output an envelope signal ENV at both ends of the low-pass filter. Meanwhile, envelope detector 11 generates an envelope signal ENV by interpolating the peak values of baseband signal samples when it is implemented in a digital manner.

The dynamic bias modulator 12 is fed with relatively high first bias voltage VDDH and relatively low second bias voltage VDDL. The dynamic bias modulator 12 compares the voltage of the envelope signal ENV with envelope reference voltage VREF and outputs the relatively high first bias voltage VDDH as a variable bias voltage VBIAS in response to the voltage of the envelope signal ENV being higher than the envelope reference voltage VREF, and outputs the relatively low second bias voltage VDDL as variable bias voltage VBIAS in response to the voltage of the envelope signal ENV being lower than the envelope reference voltage VREF.

For this purpose, the dynamic bias modulator 12 may include a comparator 121 and a switching unit 122. The comparator 121 is configured to compare the voltage of the envelope signal ENV with the envelope reference voltage VREF and to output a bias selection signal SEL based on the results of the comparison. The switching unit 122 is configured to select one of the relatively high first bias voltage VDDH and the relatively low second bias voltage VDDL in response to the bias selection signal SEL and to output the variable bias voltage VBIAS.

In an embodiment, in response to the average output power being higher than a predetermined upper limit level or lower than a predetermined lower limit level, the dynamic bias modulator 12 may output one of the first and second bias voltages VDDH and VDDL as the variable bias voltage VBIAS based on the magnitude of the average output power in preference to the results of the comparison between the voltage of the envelope signal ENV and the envelope reference voltage VREF.

For example, the dynamic bias modulator 12 may output the relatively high first bias voltage VDDH as the variable bias voltage VBIAS regardless of the magnitude of the envelope signal ENV in response to the magnitude of the average output power being higher than the predetermined upper limit level. In contrast, the dynamic bias modulator 12 may output the relatively low second bias voltage VDDL as the variable bias voltage VBIAS regardless of the magnitude of the envelope signal ENV in response to the average output power being lower than the predetermined lower limit level.

The multiple output bias voltage generation unit 13 feeds the relatively high first bias voltage VDDH and the relatively low second bias voltage VDDL to the dynamic bias modulator 12.

The multiple output bias voltage generation unit 13 generates bias voltages having different voltage levels, e.g., first and second bias voltages VDDH and VDDL. The bias voltages may be generated using a single inductor L configured to be fed with energy by a single input voltage and a plurality of capacitors, e.g., first capacitor C1 and second capacitor C2, connected to the inductor L in a non-overlapping manner. In this case, being connected in a non-overlapping manner refers to the fact that only one of the plurality of capacitors is electrically connected to the inductor L in any one time interval.

The multiple output bias voltage generation unit 13 intermittently accumulates energy in the inductor L as a result of the inductor L being switchingly connected to the input voltage VDD in response to the inductor switching signal SW. Furthermore, the multiple output bias voltage generation unit 13 selectively transfers the energy of the inductor L to one of the plurality of capacitors C1 and C2 in response to the first and second switching signals SW1 and SW2, i.e., allows current to selectively flow from the inductor L to one of the first and second capacitors C1 and C2 in response to the first and second switching signals SW1 and SW2. This generates the first and second bias voltages VDDH and VDDL having different voltage levels from the energy with which the first and second capacitors C1 and C2 have been charged.

For this purpose, the multiple output bias voltage generation unit 13 includes a switching signal generation unit 131 using the structure of a multiple loop DC-DC buck converter.

The switching signal generation unit 131 may amplify an error obtained by comparing the first bias voltage VDDH with the first reference voltage VREFH, and may generate pulse width-modulated inductor switching signals SW based on the results of the comparison between the error amplification signal and a triangular or sawtooth wave in a predetermined period.

Furthermore, the switching signal generation unit 131 may amplify an error obtained by comparing the first bias voltage VDDH with the first reference voltage VREFH, and may generate pulse width-modulated inductor switching signals SW1 and SW2 based on the results of the comparison between the error amplification signal and a triangular or sawtooth wave in a predetermined period. In this case, the first switching signal SW1 and the second switching signal SW2 are complementary to each other.

In this case, although the inductor switching signal SW and the first and second switching signals SW1 and SW2 may have the same period and the same phase when being generated based on a triangular or sawtooth wave in the same period and phase, the duty of the inductor switching signal SW is directly related to the duties of the first and second switching signals SW1 and SW2.

In an embodiment, the multiple output bias voltage generation unit 13 may generate first and second bias voltages VDDH and VDDL so that each of the first and second bias voltages VDDH and VDDL has one of a plurality of discontinuous voltage levels based on the magnitude of the average output power.

In this case, the switching signal generation unit 131 may discontinuously adjust the first and second reference voltages VREFH and VREFL based on the magnitude of the average output power, thereby generating the first and second bias voltages VDDH and VDDL each having one of a plurality of discontinuous voltage levels.

Alternatively, the switching signal generation unit 131 may discontinuously adjust the gain of an operational amplifier for amplifying an error obtained by comparing first and second bias voltages VDDH and VDDHL with the first and second reference voltages VREFH and VREFL, respectively, based on the magnitude of the average output power, thereby generating first and second bias voltages VDDH and VDDL each having one of a plurality of discontinuous voltage levels.

In an embodiment, the multiple output bias voltage generation unit 13 may generate first and second bias voltages VDDH and VDDL so that the first and second bias voltages VDDH and VDDL are continuously variable based on the magnitude of the average output power.

In this case, the switching signal generation unit 131 continuously varies the first and second reference voltages VREFH and VREFL based on the magnitude of the average output power, thereby generating the first and second bias voltages VDDH and VDDL that are continuously variable.

Alternatively, the switching signal generation unit 131 continuously adjusts the error amplification gain of the error amplifier for amplifying an error obtained by comparing the first and second bias voltages VDDH and VDDHL with the first and second reference voltages VREFH and VREFL, respectively, based on the magnitude of the average output power, thereby generating the first and second bias voltages VDDH and VDDL that are continuously variable.

In an embodiment, in response to the dynamic bias modulator 12 outputting the first and second bias voltages VDDH and VDDL, as the variable bias voltage VBIAS based on the magnitude of the average output power, the multiple output bias voltage generation unit 13 connects one of a plurality of capacitors C1 and C2. The connection is based on the magnitude of the average output power to the inductor L, which results in feeding only one of the first bias voltage VDDH and second bias voltage VDDL to the dynamic bias modulator 12 based on the magnitude of the average output power.

For example, the multiple output bias voltage generation unit 13, if the magnitude of the average output power is higher than a predetermined upper limit level and thus the relatively high first bias voltage VDDH is output, may generate the first and second switching signals SW1 and SW2 so that the inductor L is always connected to the first capacitor C1 and is not connected to the second capacitor C2.

Furthermore, for example, the multiple output bias voltage generation unit 13, if the magnitude of the average output power is lower than the predetermined lower limit level and thus the relatively low second bias voltage VDDL is output, may generate the first and second switching signals SW1 and SW2 so that the inductor L is always connected to the second capacitor C2 and is not connected to the first capacitor C1.

The power amplifier 14 may receive an RF signal, may amplify the power of the RF signal in response to the variable bias voltage VBIAS variably fed by the dynamic bias modulator 12, and may output the amplified RF signal to the antenna.

Figure 2:
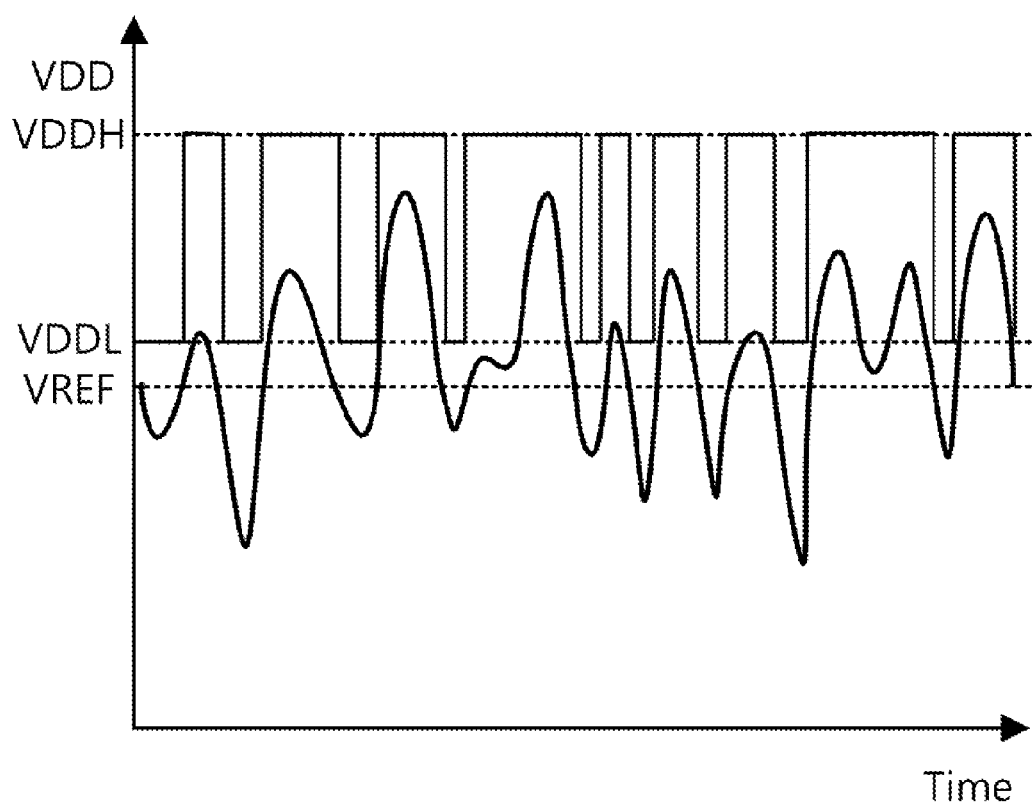
FIGS. 2 and 3 are graphs illustrating examples in which first and second bias voltages output by a dynamic bias modulator vary based on the envelope of an output RF signal.
Figure 3:
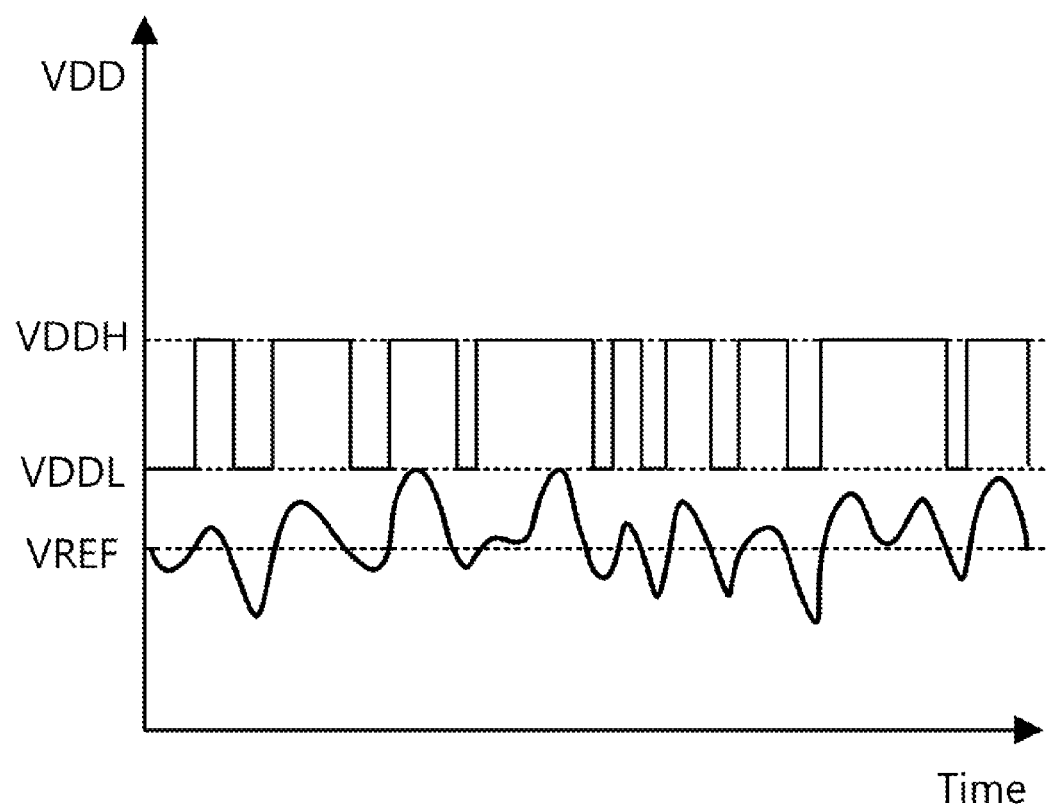

FIGS. 2 and 3 are graphs illustrating examples in which first and second bias voltages output by a dynamic bias modulator vary based on the envelope of an output RF signal.

Referring to FIGS. 2 and 3, the dynamic bias modulator 12 of FIG. 1 outputs the first and second bias voltages VDDH and VDDL so that the first and second bias voltages VDDH and VDDL are increased or decreased based on an average output power value set for the power amplification apparatus 10.

FIG. 2 illustrates an example in which the average output power value set for the power amplification apparatus 10 is large. The first bias voltage VDDH is generation at a voltage level equal to, e.g., that of operating voltage VDD, and the second bias voltage VDDL is generated at a voltage level considerably lower than that of the first bias voltage VDDH.

While the voltage of the envelope signal ENV is lower than a predetermined envelope reference voltage VREF, the variable bias voltage VBIAS is output at the voltage level of the second bias voltage VDDL. In contrast, while the voltage of the envelope signal ENV is higher than the predetermined envelope reference voltage VREF, the variable bias voltage VBIAS is output at the voltage level of the first bias voltage VDDH.

FIG. 3 illustrates a example in which the average output power value set for the power amplification apparatus 10 is low. The first bias voltage VDDH is generated at a voltage level considerably lower than that of the operating voltage VDD, e.g., about half of that of the operating voltage VDD, and the second bias voltage VDDL is generated at a voltage level lower than that of the first bias voltage VDDH.

In the same manner as in the case of FIG. 2, in response to the voltage of the envelope signal ENV being lower than a predetermined envelope reference voltage VREF, the variable bias voltage VBIAS is output at the voltage level of the second bias voltage VDDL. In contrast, in response to the voltage of the envelope signal ENV being higher than the predetermined envelope reference voltage VREF, the variable bias voltage VBIAS is output at the voltage level of the first bias voltage VDDH.

In a conventional power amplification apparatus, variable bias voltage is output as one of the maximum level (VDD) bias voltage and low bias voltage, and thus the power amplification apparatus is driven using the maximum level bias voltage even when the width of the envelope signal ENV is small, with the result that the power efficiency of the power amplification apparatus is low.

In contrast, in the power amplification apparatus of the present disclosure, as can be seen in FIG. 3, the voltage level of the variable bias voltage VBIAS is not considerably higher than that of the envelope signal ENV even when the voltage of the envelope signal ENV is higher than the envelope reference voltage VREF, with the result that the power efficiency of the power amplification apparatus 10 is improved.

Figure 4:
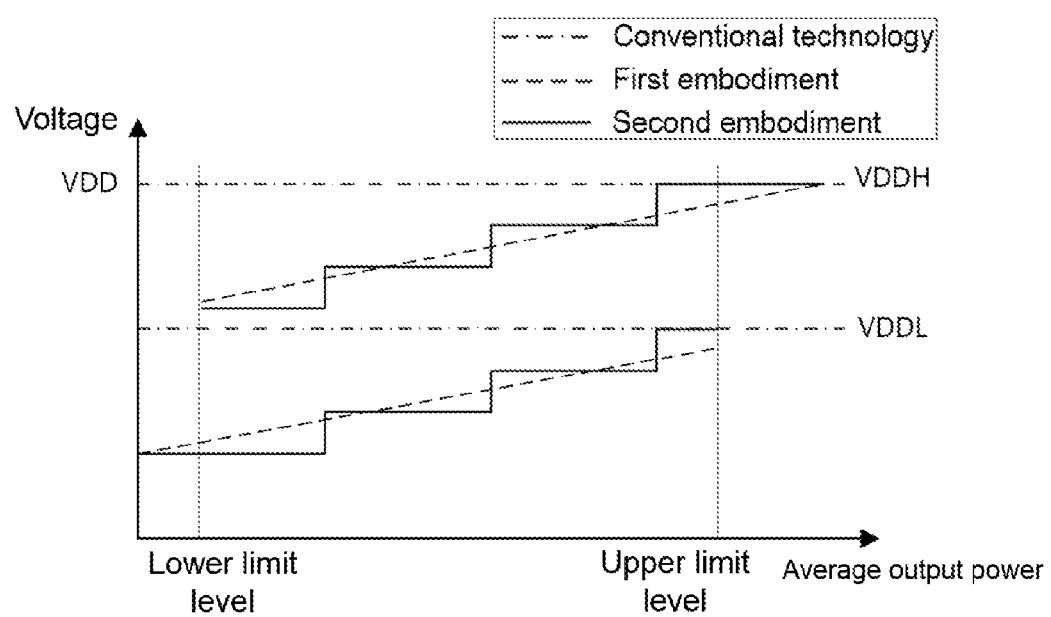
FIG. 4 is a graph illustrating an example of the relationships between first and second bias voltages output by a dynamic bias modulator, and average output power.

FIG. 4 is a graph illustrating the relationships between first and second bias voltages, output by a dynamic bias modulator according to an embodiment of the present disclosure, and average output power.

Referring to FIG. 4, curves indicated by the dash-dot-dash lines show the relationships between bias voltages based on a discontinuous bias modulation technique using conventional fixed bias voltages having two fixed levels and average output power.

When the first and second bias voltages VDDH and VDDL are designed to have continuously increasing or decreasing values, the curves indicated by the dash lines illustrate the relationships between the first and second bias voltages VDDH and VDDL and average output power.

These relationships correspond to one of the embodiments illustrated in FIG. 1 in which the multiple output bias voltage generation unit 13 generates continuously increasing or decreasing first and second bias voltages VDDH and VDDL using continuously variable reference voltages VREFH and VREFL or continuously variable error amplification gain values.

When the first and second bias voltages VDDH and VDDL are designed to have discontinuously increasing or decreasing values, the curves indicated by the dash lines illustrate the relationships between first and second bias voltages VDDH and VDDL and average output power.

These relationships correspond to one of the embodiments illustrated in FIG. 1 in which the multiple output bias voltage generation unit 13 generates discontinuously increasing or decreasing first and second bias voltages VDDH and VDDL using reference voltages VREFH and VREFL having discontinuous voltage levels or discontinuously variable error amplification gain values.

Meanwhile, in an embodiment, when the level of the average output power is lower than a predetermined lower limit level, the multiple output bias voltage generation unit 13 may not generate the first bias voltage VDDH any longer, and may feed only the second bias voltage VDDL.

In the same manner, when the level of the average output power is higher than the predetermined upper limit level, the multiple output bias voltage generation unit 13 may not generate the second bias voltage VDDL any longer, and may feed only the first bias voltage VDDH.

Figure 5:
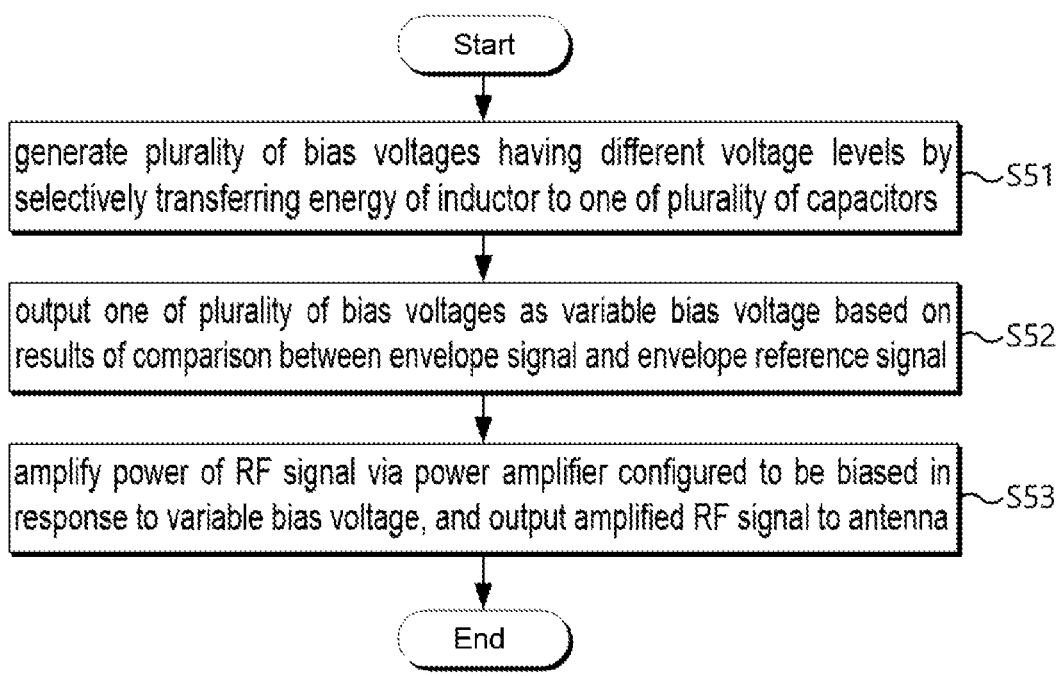
FIG. 5 is a flowchart illustrating a power amplification method using a dynamic bias modulator with a multiple output voltage converter according to an embodiment.

FIG. 5 is a flowchart illustrating a power amplification method using a dynamic bias modulator with a multiple output voltage converter according to an embodiment of the present disclosure.

Referring to FIG. 5, at step S51 of the power amplification method according to the present embodiment, the power amplification apparatus 10 may generate first and second bias voltages VDDH and VDDL having different voltage levels using the single inductor L configured to be fed with energy by the input voltage VDD and the plurality of capacitors C1 and C2 connected to the inductor L in an non-overlapping manner.

In an embodiment, at step S51, the power amplification apparatus 10 switchingly connects the inductor L to input voltage VDD in response to an inductor switching signal SW, thereby intermittently accumulating energy in the inductor L. Furthermore, the power amplification apparatus 10 selectively transfers the energy of the inductor L to one of the plurality of capacitors C1 and C2 in response to first and second switching signals SW1 and SW2, thereby generating the first and second bias voltages VDDH and VDDL having different voltage levels from the energy with which the first and second capacitors C1 and C2 have been charged.

In an embodiment, at step S51, the power amplification apparatus 10 is operative to amplify an error obtained by comparing the first bias voltage VDDH with first reference voltage VREFH, may generate a pulse width-modulated inductor switching signal SW based on the results of the comparison between the amplified error and a triangular wave or sawtooth wave in a predetermined period, may amplify an error obtained by comparing the second bias voltage VDDL with a second reference voltage VREFL, and may generate the pulse width modulated first and second switching signals SW1 and SW2 based on the results of the comparison between the amplified error and a triangular wave or sawtooth wave. In this case, the first switching signal SW1 and the second switching signal SW2 are complementary to each other.

In an embodiment, at step S51, the power amplification apparatus 10 discontinuously adjusts the first and second reference voltages VREFH and VREFL based on the magnitude of average output power, or discontinuously adjusts amplification gains related to errors obtained by comparing the first and second bias voltages VDDH and VDDL with the first and second reference voltages VREFH and VREFL, respectively, thereby generating the first and second bias voltages VDDH and VDDL each having one of discontinuous voltage levels based on the average output power.

In an embodiment, at step S51, the power amplification apparatus 10 continuously varies the first and second reference voltages VREFH and VREFL based on the magnitude of the average output power, or continuously varies amplification gains related to errors obtained by comparing the first and second bias voltages VDDH and VDDL with the first and second reference voltages VREFH and VREFL, respectively, thereby generating the first and second bias voltages VDDH and VDDL so that the first and second bias voltages VDDH and VDDL continuously vary based on the average output power.

Thereafter, at step S52, the power amplification apparatus 10 may output relatively high first bias voltage VDDH or relatively low second bias voltage VDDL as variable bias voltage VBIAS based on the results of the comparison between the envelope signal ENV of the RF signal and the envelope reference voltage VREF.

In an embodiment, at step S52, the power amplification apparatus 10, if the level of the average output power is higher than a predetermined upper limit level or lower than a predetermined lower limit level, may output only one of the first and second bias voltages VDDH and VDDL as variable bias voltage VBIAS based on the magnitude of the average output power in preference to the results of the comparison between the envelope of the signal ENV and the envelope reference voltage VREF.

For example, at step S52, the power amplification apparatus 10 outputs the relatively high first bias voltage VDDH as variable bias voltage VBIAS regardless of the magnitude of the envelope signal ENV if the level of the average output power is higher than a predetermined upper limit level, and may output the relatively low second bias voltage VDDL as variable bias voltage VBIAS regardless of the magnitude of the envelope signal ENV if the level of the average output power is lower than the predetermined lower limit level.

In this case, at step S52, the power amplification apparatus 10 may exclusively connect only one of the plurality of capacitors C1 and C2, selected based on the magnitude of the average output power, to the inductor L, thereby generating only one of the first and second bias voltages VDDH and VDDL.

Thereafter, at step S53, the power amplification apparatus 10 may amplify the power of the RF signal via a power amplifier configured to be biased in response to the variable bias voltage VBIAS, and may output the amplified RF signal to the antenna.

A dynamic bias modulator with a multiple output voltage converter and a power amplification apparatus using the same according to at least one embodiment of the present disclosure can be implemented in a small chip or substrate area.

A dynamic bias modulator with a multiple output voltage converter and a power amplification apparatus using the same according to at least one embodiment of the present disclosure can feed discontinuously or continuously variable bias voltage.

A dynamic bias modulator with a multiple output voltage converter and a power amplification apparatus using the same according to at least one embodiment of the present disclosure can operate in average power tracking mode by feeding only low output voltage when average output power is low.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplification apparatus, comprising:
a multiple output bias voltage generation unit generating first and second bias voltages using an inductor coupled between an input voltage and a plurality of capacitors, the plurality of capacitors being connected to the inductor in a non-overlapping manner;
a dynamic bias modulator outputting the first bias voltage or the second bias voltage as a variable bias voltage based on results of comparing voltage of an envelope signal of a radio frequency (RF) signal to an envelope reference voltage; and
a power amplifier configured to be biased in response to the variable bias voltage, to amplify power of the RF signal, and to output the amplified RF signal to an antenna.

2. The power amplification apparatus of claim 1, wherein the inductor is switchingly connected to the input voltage and the multiple output bias voltage generation unit is operative to:
intermittently accumulate energy in the inductor in response to an inductor switching signal; and
generate the first and second bias voltages having different voltage levels from energy with which the first and second capacitors have been charged by selectively transferring the energy of the inductor to one of the plurality of capacitors in response to first and second switching signals.

3. The power amplification apparatus of claim 1, wherein:
the multiple output bias voltage generation unit comprises a switching signal generation unit configured to generate the inductor switching signal, the first switching signal, and the second switching signal;
the switching signal generation unit is operative to:
amplify an error obtained by comparing the first bias voltage with the first reference voltage, and generate a pulse width-modulated inductor switching signal based on results of comparison between the amplified error and a triangular or sawtooth wave in a predetermined period; and
amplify an error obtained by comparing the second bias voltage with second reference voltage, and generate a pulse width-modulated first and second switching signals based on results of comparison between the amplified error and the triangular or sawtooth wave; and
the first switching signal and the second switching signal are complementary to each other.

4. The power amplification apparatus of claim 3, wherein the switching signal generation unit is operative to discontinuously adjust the first and second reference voltages based on magnitude of average output power.

5. The power amplification apparatus of claim 3, wherein the switching signal generation unit is operative to discontinuously adjust amplification gains related to errors obtained by comparing the first and second bias voltages with the first and second reference voltages, respectively, based on magnitude of average output power.

6. The power amplification apparatus of claim 3, wherein the switching signal generation unit is operative to continuously vary the first and second reference voltages based on magnitude of average output power.

7. The power amplification apparatus of claim 3, wherein the switching signal generation unit is operative to continuously vary amplification gains related to errors obtained by comparing the first and second bias voltages with the first and second reference voltages, respectively, based on magnitude of average output power.

8. The power amplification apparatus of claim 1, wherein in response to the average output power being higher than a predetermined upper limit level or lower than a predetermined lower limit level, the dynamic bias modulator is operative to output only one of the first and second bias voltages as the variable bias voltage based on magnitude of the average output power, in preference to results of comparison between voltage of the envelope signal and the envelope reference voltage.

9. The power amplification apparatus of claim 8, wherein the dynamic bias modulator is operative to:
output the relatively high first bias voltage as the variable bias voltage regardless of magnitude of the envelope signal in response to the average output power being higher than a predetermined upper limit level; and
output the relatively low second bias voltage as the variable bias voltage regardless of magnitude of the envelope signal in response to the average output power being lower than a predetermined lower limit level.

10. The power amplification apparatus of claim 8, wherein the multiple output bias voltage generation unit is operative to feed either the first bias voltage or the second bias voltage to the dynamic bias modulator by exclusively connecting only one of the plurality of capacitors, selected based on the magnitude of the average output power, to the inductor.

11. A power amplification method using a power amplification apparatus with a multiple output voltage converter, comprising:
by the power amplification apparatus:
generating first and second bias voltages having different voltage levels using a single inductor coupled between an input voltage and a plurality of capacitors, the plurality of capacitors being connected to the inductor in a non-overlapping manner;
outputting the first bias voltage or the second bias voltage as variable bias voltage based on results of comparing voltage of an envelope signal of a radio frequency (RF) signal to an envelope reference voltage; and
amplifying power of the RF signal via a power amplifier configured to be biased in response to the variable bias voltage, and outputting the amplified RF signal to an antenna.

12. The power amplification apparatus of claim 1, wherein the first and second bias voltages have different voltage levels.

* * * * *